United States Patent
Naor Pomerantz et al.

(10) Patent No.: US 12,199,561 B2
(45) Date of Patent: Jan. 14, 2025

(54) HEAT DISSIPATION FOR A PHOTOVOLTAIC JUNCTION BOX

(71) Applicant: Solaredge Technologies Ltd., Herzeliya (IL)

(72) Inventors: Adi Naor Pomerantz, Tel Aviv (IL); Dan Ilani, Tel Aviv (IL); Meir Gazit, Ashkelon (IL); Guy Sella, Bitan Aharon (IL); Yoav Galin, Ra'anana (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 18/451,337

(22) Filed: Aug. 17, 2023

(65) Prior Publication Data

US 2023/0402967 A1 Dec. 14, 2023

Related U.S. Application Data

(63) Continuation of application No. 17/000,960, filed on Aug. 24, 2020, now Pat. No. 11,777,444, which is a
(Continued)

(51) Int. Cl.
*H02G 3/08* (2006.01)
*H01L 31/052* (2014.01)
(Continued)

(52) U.S. Cl.
CPC .......... *H02S 40/345* (2014.12); *H01L 31/052* (2013.01); *H02G 3/16* (2013.01)

(58) Field of Classification Search
CPC . H02G 3/16; H02G 3/08; H02G 3/081; H02S 40/345; H02S 40/32; H02S 40/34;
(Continued)

(56) References Cited

U.S. PATENT DOCUMENTS

| 6,828,503 B2 | 12/2004 | Yoshikawa et al. |
| 7,291,036 B1 | 11/2007 | Daily et al. |

(Continued)

FOREIGN PATENT DOCUMENTS

| EP | 1777754 A1 | 4/2007 |
| JP | H3-235610 A | 10/1991 |

(Continued)

OTHER PUBLICATIONS

Aug. 13, 2018—European Search Report for EP 18163274.6.
(Continued)

*Primary Examiner* — Angel R Estrada
(74) *Attorney, Agent, or Firm* — Banner & Witcoff, Ltd.

(57) ABSTRACT

An apparatus of a junction box component housed in a junction box and designed to be coupled to a power generator. The junction box component may include one or more bypass mechanisms configured to bypass one or more substrings of the power generator in a case of malfunction or mismatch between the substring and the remainder of the power generators. The one or more bypass mechanisms may generate heat which may be transferred out of the junction box. The junction box component may be designed to conduct the heat towards the base of the junction box and/or the cover of the junction box. A heat dissipation mechanism may be mounted on the base and/or the cover. A bypass mechanism may bypass the entire power generator.

19 Claims, 13 Drawing Sheets

Related U.S. Application Data continuation of application No. 15/934,002, filed on Mar. 23, 2018, now Pat. No. 10,790,780.

(60) Provisional application No. 62/478,245, filed on Mar. 29, 2017.

(51) Int. Cl.
*H02G 3/16* (2006.01)
*H02S 40/34* (2014.01)

(58) Field of Classification Search
CPC ....... H01L 31/052; H01L 31/06; H01L 3/104; H01L 31/04; H05K 7/06; H05K 7/20; H05K 7/00
USPC .......... 174/548, 50, 520; 361/600, 601, 676, 361/641, 679.46
See application file for complete search history.

(56) References Cited

U.S. PATENT DOCUMENTS

| | | | |
|---|---|---|---|
| 8,128,439 B2 | 3/2012 | Feldmeier et al. | |
| 8,308,504 B2 | 11/2012 | Ackermann et al. | |
| 8,512,050 B2 | 8/2013 | McGreevy et al. | |
| 8,895,852 B2 * | 11/2014 | Sella | H01R 13/6641 361/679.01 |
| 9,101,082 B1 | 8/2015 | Dorenkamp et al. | |
| 10,658,833 B2 * | 5/2020 | Galin | H02S 40/36 |
| 10,790,780 B2 * | 9/2020 | Pomerantz | H01L 31/052 |
| 11,062,588 B2 * | 7/2021 | Galin | G01K 3/005 |
| 11,777,444 B2 * | 10/2023 | Pomerantz | H02S 40/345 174/50 |
| 2007/0137689 A1 | 6/2007 | Feldmeier et al. | |
| 2008/0190477 A1 | 8/2008 | Hattori | |
| 2009/0272574 A1 | 11/2009 | Richter et al. | |
| 2011/0195585 A1 | 8/2011 | Feldmeier et al. | |
| 2011/0212647 A1 | 9/2011 | Boensch et al. | |
| 2012/0033392 A1 | 2/2012 | Golubovic et al. | |
| 2012/0205149 A1 | 8/2012 | Lenel | |
| 2013/0003307 A1 | 1/2013 | Jang | |
| 2014/0266289 A1 | 9/2014 | Della Sera et al. | |
| 2015/0103497 A1 | 4/2015 | Cioffi et al. | |
| 2016/0013642 A1 | 1/2016 | Linderman | |
| 2019/0028058 A1 | 1/2019 | Lu | |
| 2019/0173421 A1 | 6/2019 | Loewenstern et al. | |

FOREIGN PATENT DOCUMENTS

| | | | |
|---|---|---|---|
| JP | 2000133831 A | 5/2000 | |
| JP | 2006073978 A | 3/2006 | |
| JP | 2006136147 A | 5/2006 | |
| JP | 2006269803 A | 10/2006 | |
| JP | 2007-311437 A | 11/2007 | |
| JP | 2011109029 A | 6/2011 | |
| JP | 2011518441 A | 6/2011 | |
| JP | 2012178535 A | 9/2012 | |
| JP | 2013-229424 A | 11/2013 | |
| JP | 2014017332 A | 1/2014 | |
| JP | 2014-79093 A | 5/2014 | |
| JP | 2014239161 A | 12/2014 | |
| JP | 2015211634 A | 11/2015 | |
| JP | 2016152349 A | 8/2016 | |

OTHER PUBLICATIONS

Mar. 9, 2021—EESR—EP 20206601.5.
Jul. 5, 2022—JP Office Action—JP App. No. 2021-137161.
Dec. 13, 2022—JP Notice of Allowance—JP App. No. 2021-137161.
Nov. 5, 2024—Japanese Notice of Allowance—JP App. No. 2023-002205.

* cited by examiner

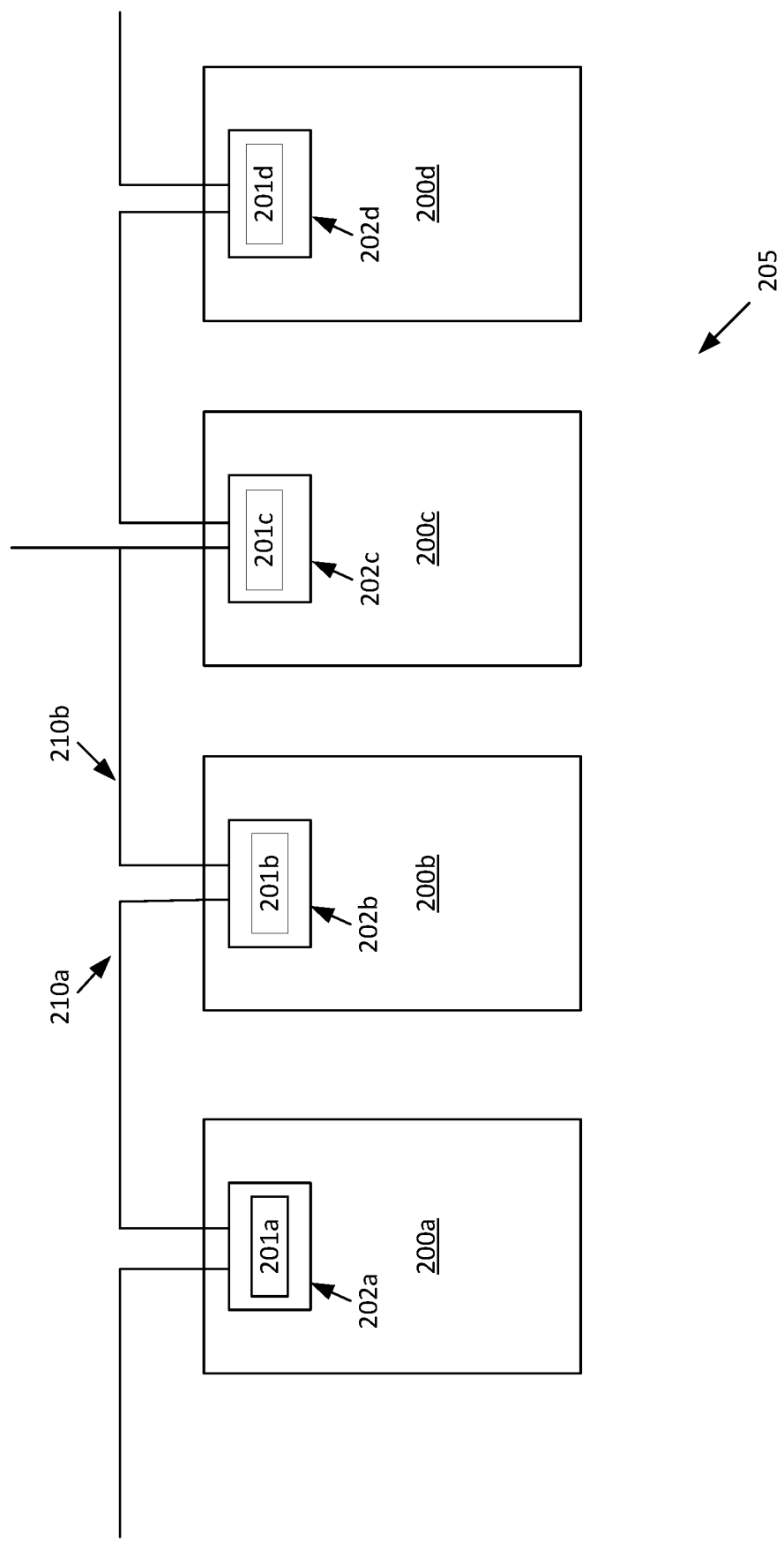

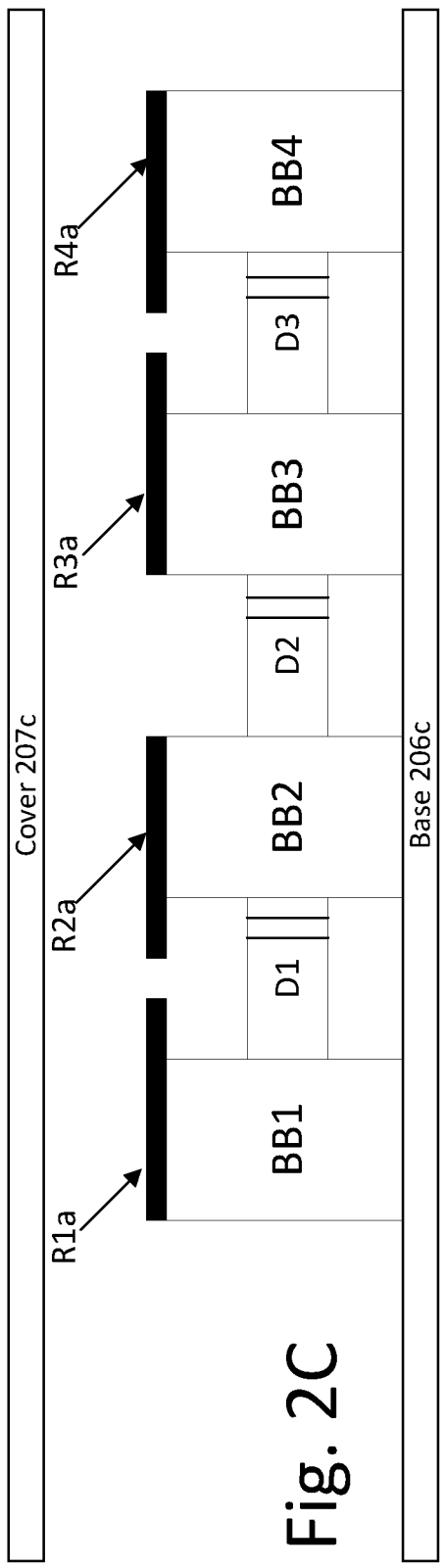
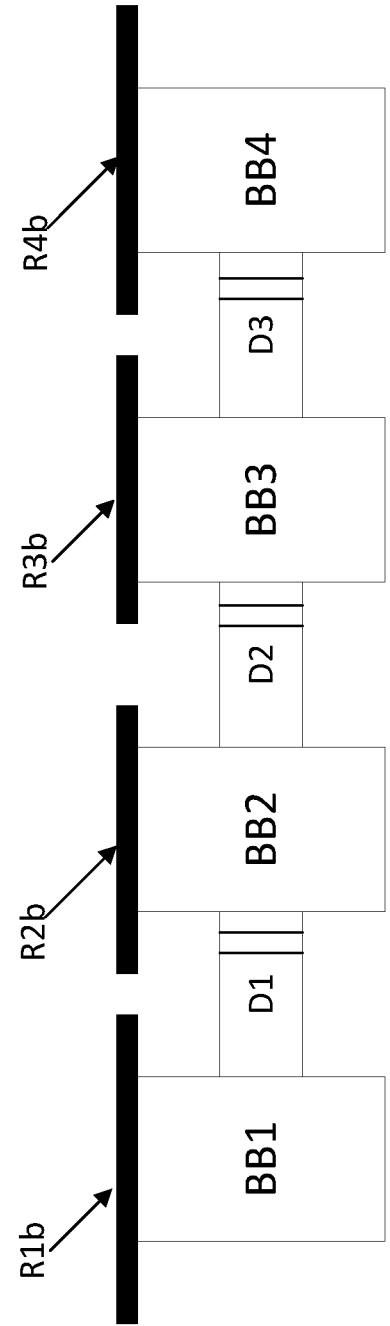
Fig. 2C
Fig. 2D

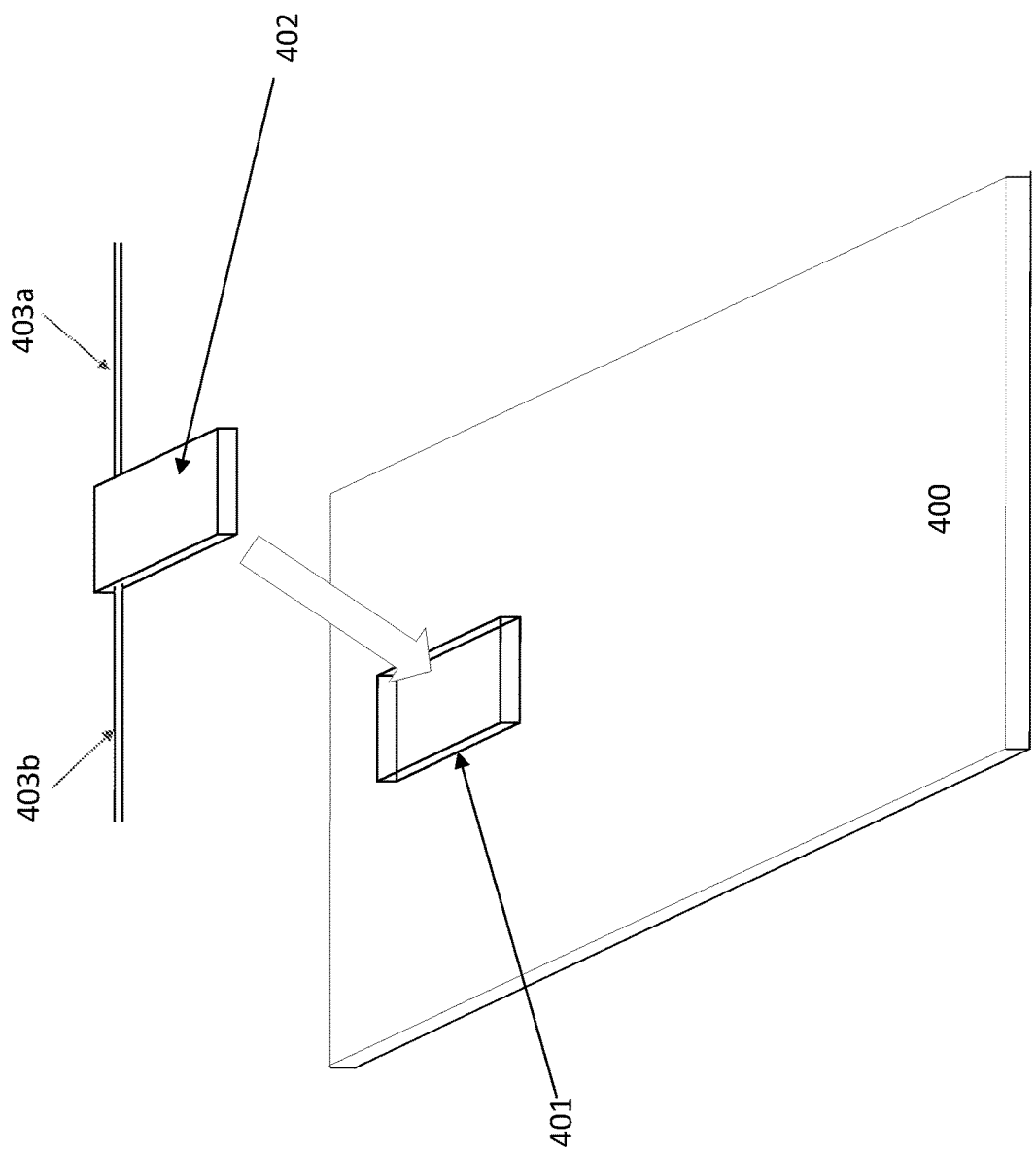

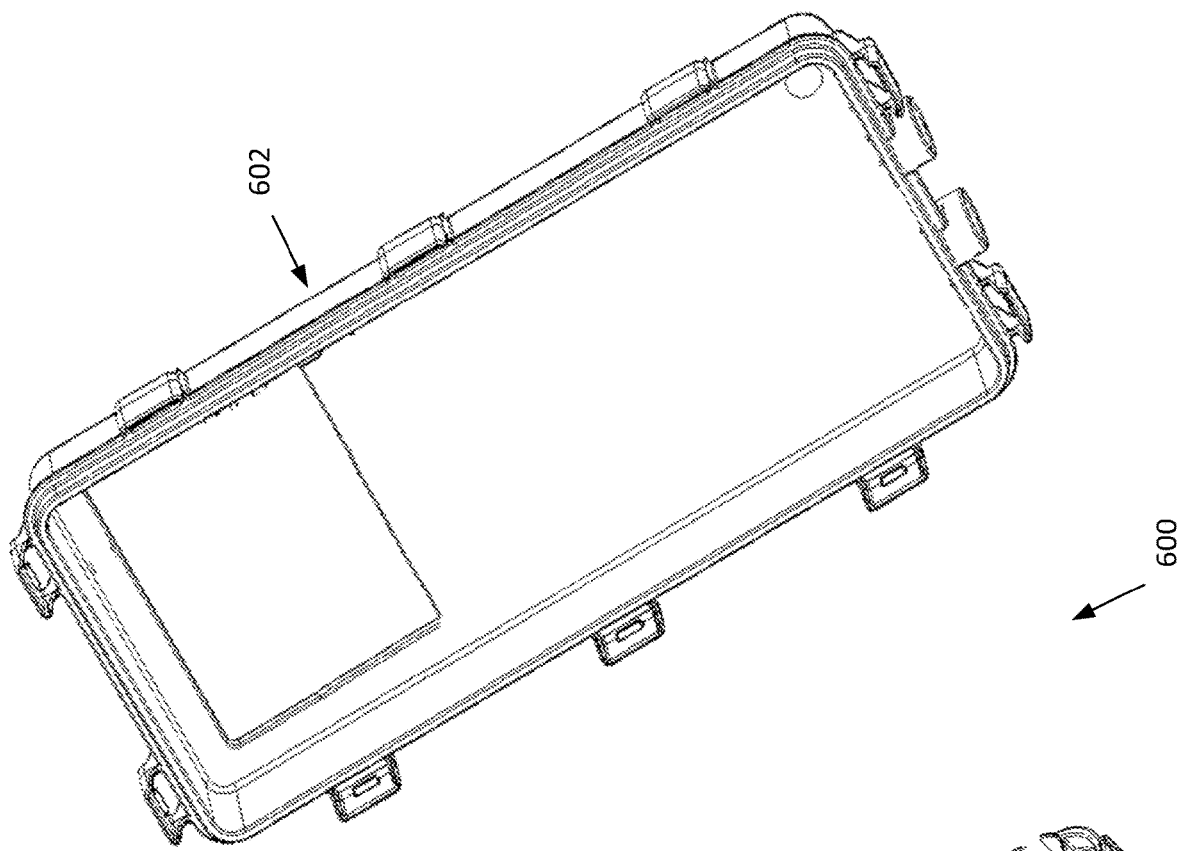
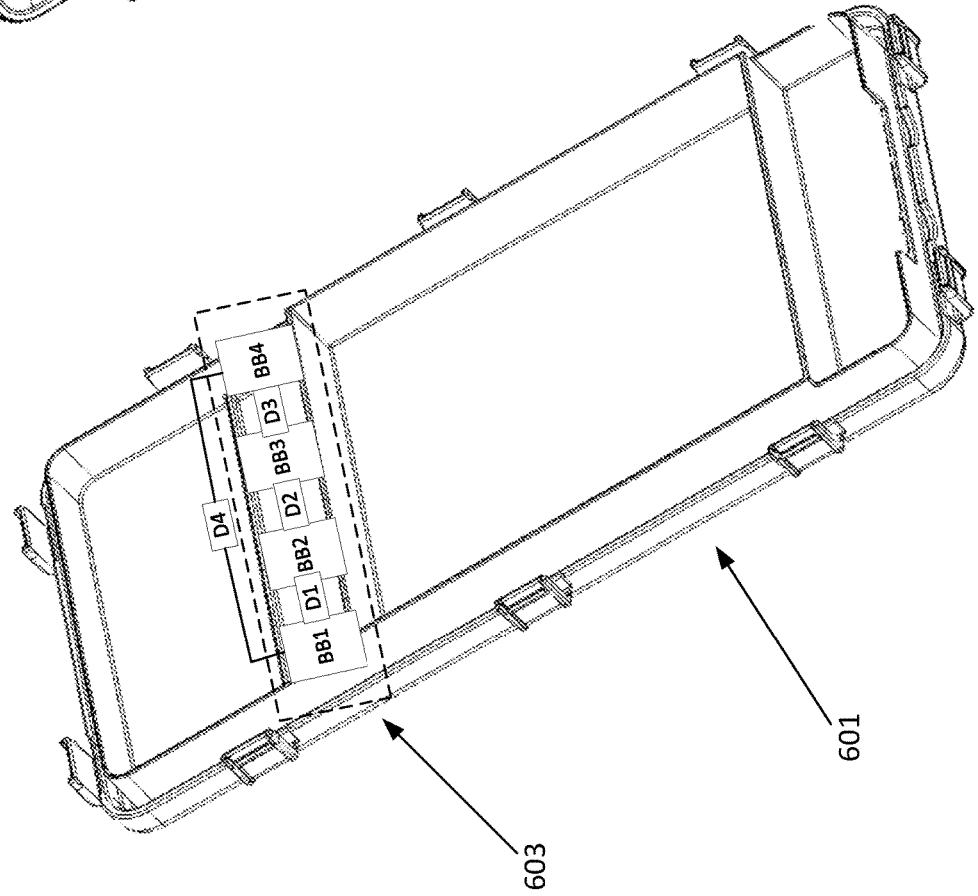
Fig. 6A

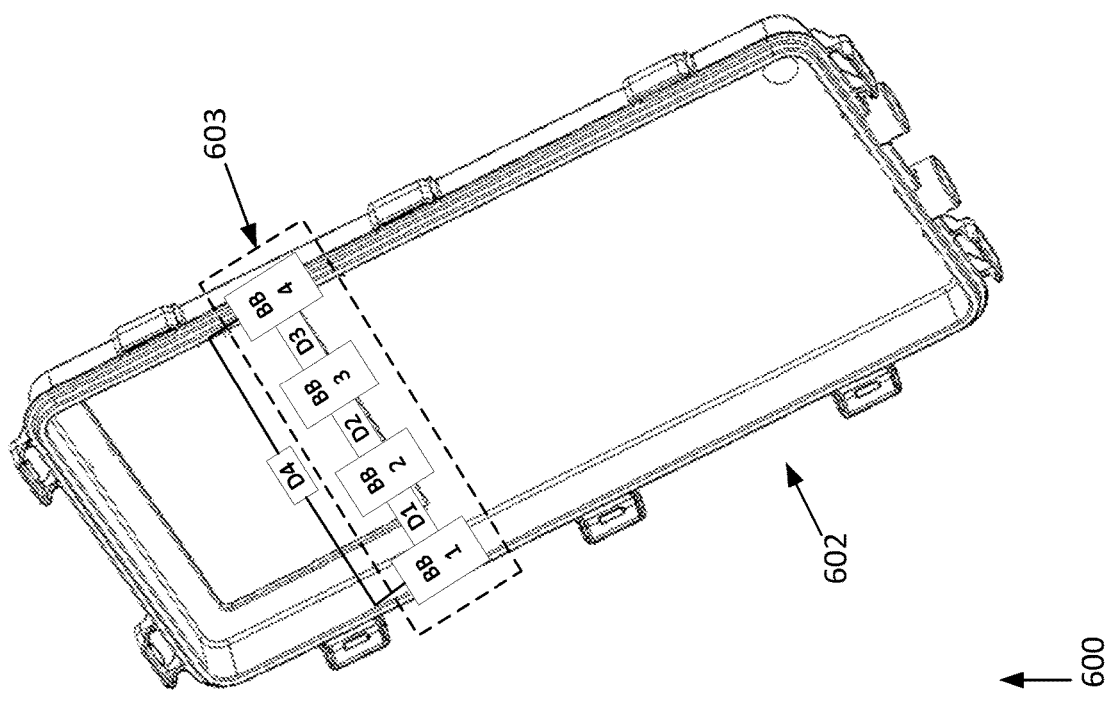
Fig. 6B
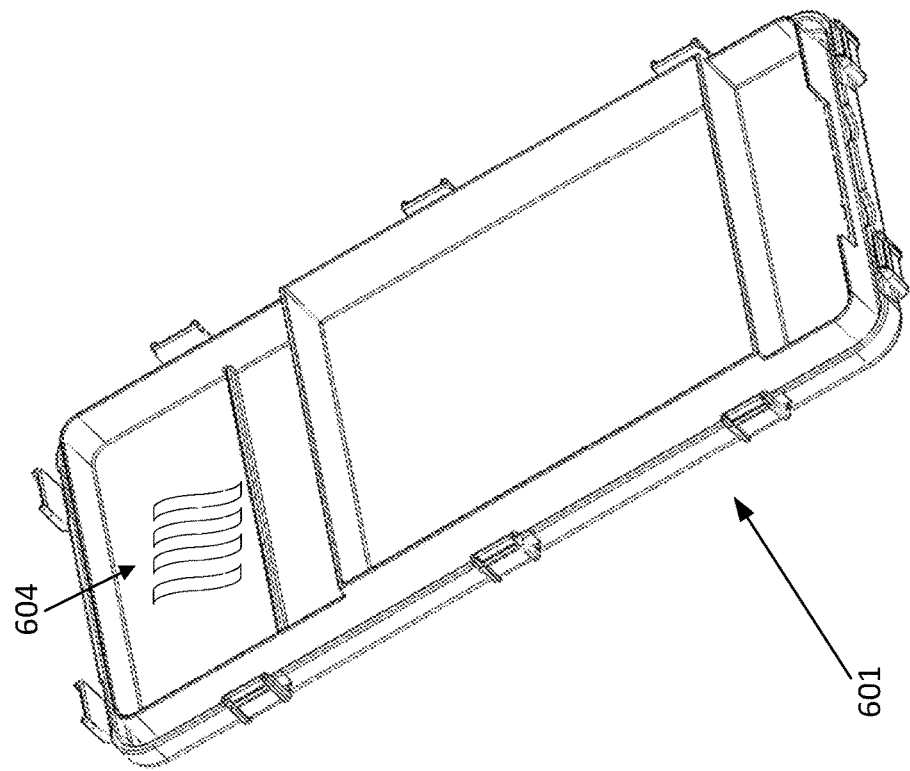

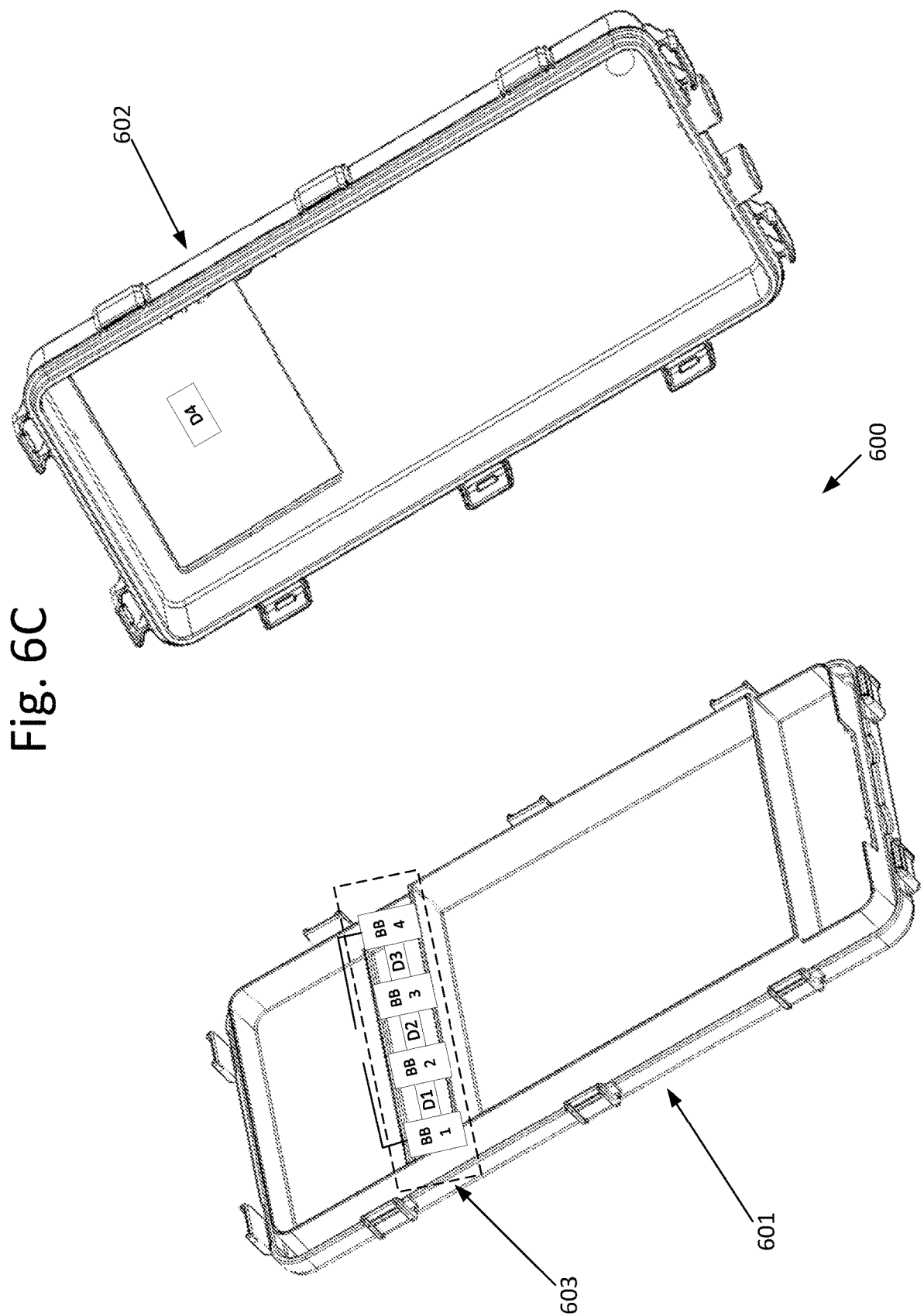

HEAT DISSIPATION FOR A PHOTOVOLTAIC JUNCTION BOX

CROSS-REFERENCE TO RELATED APPLICATION

The present application is a continuation of U.S. application Ser. No. 17/000,960, filed Aug. 24, 2020, which is a continuation of U.S. application Ser. No. 15/934,002, filed Mar. 23, 2018, now U.S. Pat. No. 10,790,780, which claims priority to U.S. Provisional Application Ser. No. 62/478,245, filed Mar. 29, 2017, and entitled "Heat Dissipation for a Photovoltaic Junction Box." The entire contents of these applications are incorporated herein by reference.

BACKGROUND

In many cases photovoltaic panels include one or more substrings of photovoltaic cells. The substrings are connected to each other and may also be connected to diodes. Each one of the diodes may function as a bypass for a respective parallel substring or several substrings. Diodes have a number of disadvantages, including substantial loss of power when current flows through the diodes. As well as power loss, the rise in temperature of the diodes may also be concerning. Because the temperatures may rise more than one would like there is a need for dissipating the heat from the surroundings of the diodes, where today many of the diodes are placed in a small box.

SUMMARY

According to illustrative embodiments disclosed herein, a bypass mechanism is adapted to bypass a photovoltaic (PV) generator, for example, a string or a substring of photovoltaic (PV) cells, and/or a PV panel. The bypass mechanism may be part of a component or circuitry housed in a photovoltaic junction box. The component may include a number of bypass mechanisms, the number which may be based according to the number of strings or substrings electrically coupled to the junction box. The component housed in the junction box may include links connecting the bypass mechanisms, also referred to as bus bars. In addition to serving as connecting links between the bypass mechanisms, the bus bars may also function as heat spreaders. The bypass mechanisms may extract substantial heat due to electrical currents flowing through the bypass mechanisms. The bus bars and bypass mechanisms may be designed and disposed in/on the junction box to effectively dissipate the extracted heat, and to avoid damage to the bypass mechanism or other components or circuitry which may be housed in the junction box. According to some aspects of the disclosure, the bus bars may spread heat the junction box cover and the cover may function as a heat sink. According to some aspects of the disclosure the bus bars may spread heat to the junction box base, and the junction box base may transfer the heat to the PV generator and to the environment. According to some aspects of the disclosure, the bus bars may spread heat to both the junction box cover and the junction box base. According to some aspects of the disclosure, other heat-spreading elements may be disposed in the junction box and designed to spread heat in multiple directions.

According to some aspects, the bypass mechanisms may be housed in and mounted to the base of the junction box, and may be permanently electrically coupled to the PV generator. According to some aspects of the disclosure, the bypass mechanisms may be mounted to the cover of the junction box, and may be electrically coupled to the PV generator only when the junction box cover is placed on the junction box base. The junction box may also house other components and/or circuitry, for example, a direct current to direct current (DC/DC) converter, a direct current to alternating current (DC/AC) converter, sensor(s)/sensor interface(s), safety devices (e.g. safety switch(es), fuse(s), relay(s), an arc-detection circuit, an arc suppression circuit, a ground-fault detector-interrupter circuit), communication module(s), control device(s) and/or monitoring modules.

According to some aspects, the number of bypass mechanisms may be the same as the number of substrings in the PV generator. According to some aspects of the disclosure, one or more additional bypass mechanisms may be coupled in a parallel configuration to the other bypass mechanisms, so that when a plurality of PV strings or substrings are bypassed, electrical losses may be reduced by allowing current to flow through a current path having fewer (e.g. one or two) bypass mechanisms.

According to some aspects, a plurality of bypass mechanisms may all be housed in either the junction box base or the junction box cover. According to some aspects of the disclosure, a first group of one or more bypass mechanisms may be disposed in the base of the junction box, and a second group of one or more bypass mechanisms may be disposed on the cover of the junction box. Distributing a plurality of bypass mechanisms between the base and the cover may, according to illustrative embodiments, increase system safety by having bypass mechanisms disposed in the base, while decreasing heat generation, increasing efficiency of heat dissipation and decreasing electrical losses by providing additional bypass mechanism disposed in the cover.

BRIEF DESCRIPTION OF THE DRAWINGS

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

FIG. 2B is part schematic, part block diagram of a PV system in accordance with one or more illustrative embodiments.

FIGS. 2C-2F illustrate four different configurations in a part schematic, part block diagram of a PV generator electrical circuit in accordance with one or more illustrative embodiments.

FIG. 4 is an illustrative sketch of elements of a PV generator junction box and a PV generator, in accordance with one or more illustrative embodiments.

FIG. 6A is a part schematic, part block diagram of a PV generator junction box with cover removed and associated circuitry wherein the associated circuitry is mounted on the PV generator junction box base in accordance with one or more illustrative embodiments.

FIG. 6B is a part schematic, part block diagram of a PV generator junction box with cover removed and associated circuitry wherein the associated circuitry is mounted on the PV generator junction box cover in accordance with one or more illustrative embodiments.

FIG. 6C is a part schematic, part block diagram of a PV generator junction box and associated circuitry wherein some of the associated circuitry is mounted on the PV generator junction box base and some of the associated circuitry is mounted on the PV generator junction box cover in accordance with one or more illustrative embodiments.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Photovoltaic (PV) systems may include one or more PV generators. Each PV generator may include one or more photovoltaic cell(s), cell string(s), cell substring(s), module(s), panel(s), shingle(s) and/or solar roof tiles. The one or more PV generators (and/or the photovoltaic cells comprising a larger PV generator) may be interconnected in a serial configuration, a parallel configuration and/or a combination thereof. Current paths may be provided for bypassing one or more photovoltaic cells or PV generators. For example, a PV generator such as a PV panel may include a number of substrings of photovoltaic cells which are configured in a serial arrangement. One or more substrings may have a bypass mechanism providing an alternative current path, allowing current to bypass an associated substring in the event of drop in a current capability of the substring, to avoid forcing a large current through the photovoltaic cells comprising the substring which may lead to large power dissipation and/or damage to the associated photovoltaic cells. Bypass mechanisms might not be entirely lossless, leading to potential power dissipation when current flows through the bypass mechanisms. It may be desirable to reduce the electrical power loss dissipated by bypass mechanisms, as well as provide effective methods for reducing and dissipating heat generated by current flowing through bypass mechanisms.

Figure 1:
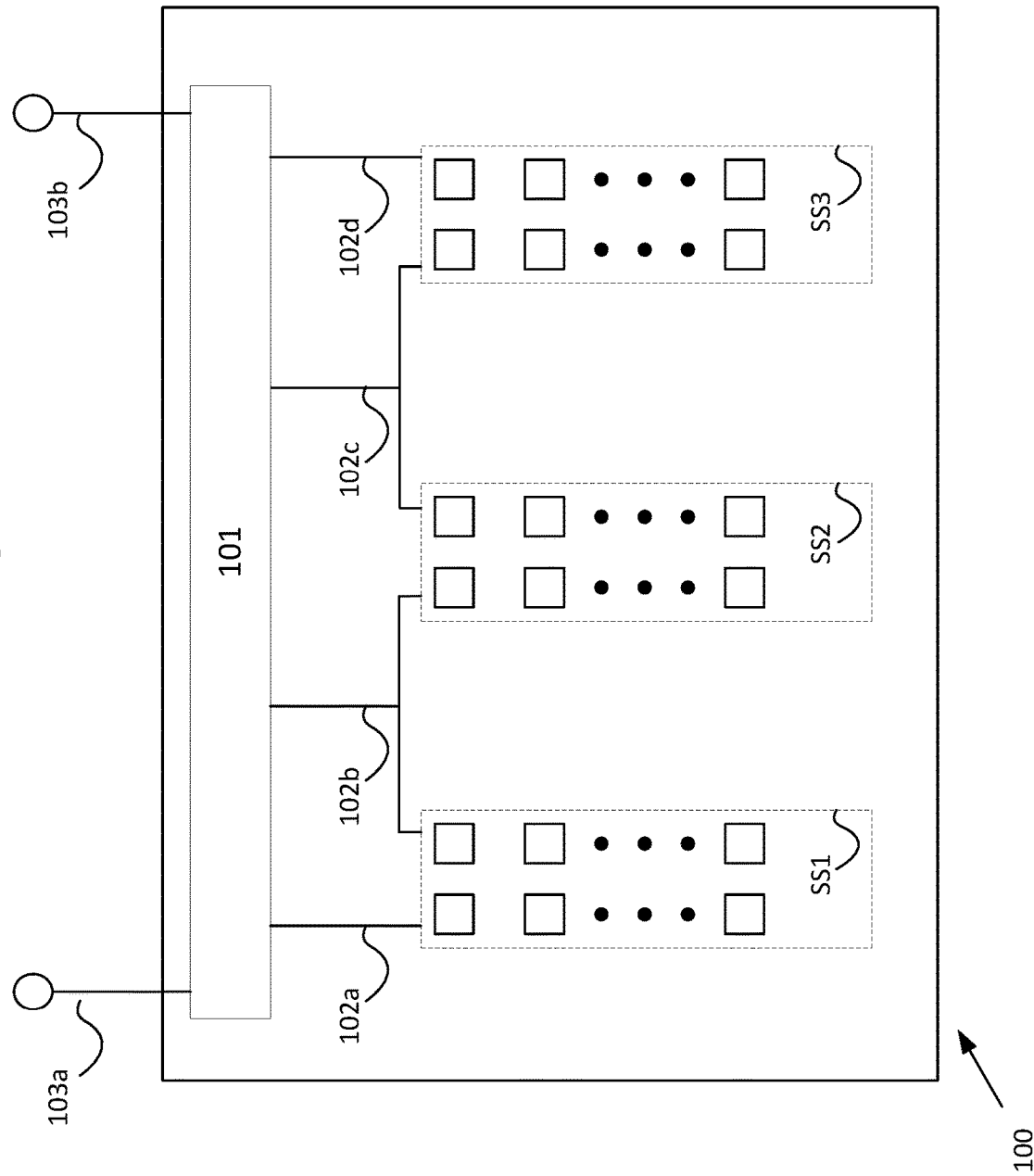
FIG. 1 is part schematic, part block diagram of a photovoltaic (PV) generator in accordance with one or more illustrative embodiments.

Reference is made to FIG. 1, which illustrates a photovoltaic (PV) generator 100 with circuitry coupled to the PV generator according to aspects of illustrative embodiments. According to some aspects of the disclosure, a PV generator may be a PV panel. A PV panel may have one or more substrings while each one of the substrings may be electrically accessible via two or more conductors. According to some aspects of the disclosure, PV generator 100 may include a first substring SS1, a second substring SS2, and a third substring SS3. Each of substrings SS1-SS3 may include a plurality of photovoltaic cells coupled in series, in parallel or in a mixed serial-parallel arrangement. Substrings SS1-SS3 may be coupled in series. Substring SS1 may be connected between conductors 102a and 102b, substring SS2 may be electrically accessible via conductors 102b and 102c, and substring SS3 may be electrically accessible via conductors 102c and 102d. Conductors 102a-d may connect substrings SS1-SS3 to junction box 101. According to some aspects of the disclosure, conductors 102a-d may include ribbon wire.

A photovoltaic panel may have one or more substrings wherein each substring may be connected to a junction box with two conductors. According to some aspects of the disclosure, Junction box 101 may provide an interface between substrings SS1-SS3 and output conductors 103a and 103b, which may output the power generated by PV generator 100. Junction box 101 may provide one or more bypass mechanisms (e.g. passive bypass mechanisms such as diodes and/or active bypass mechanism such as switches) for bypassing one or more of substrings SS1-SS3.

According to some aspects, junction box 101 may further include additional circuitry. For example, junction box 101 may have one or more power converters (e.g. DC/DC or DC/AC converters) for converting power generated by substrings SS1-SS3. According to some aspects of the disclosure, junction box 101 may provide a single power converter for converting the combined power generated by substrings SS1-SS3. In other embodiments, junction box 101 may have a plurality of power converters, each configured to convert power received from an associated substring. According to some aspects of the disclosure, the single power converter or the plurality of power converters may be configured to increase power drawn from one or more associated substrings by implementing Maximum Power Point Tracking (MPPT) and/or impedance matching. A power converter may increase power drawn from one or more associated substrings by, for example, by regulating a voltage across or current through an associated substring, such that the associated substring operates at a preferred operating point. A power converter may be controlled by a control device, and the control device may be responsive to sensor(s)/sensor interface(s), such as current, voltage, power, temperature and/or solar irradiance sensor(s)/sensor interface(s).

PV panels may additionally or alternatively include a junction-box integrated power converter. The power converter may be, for example, a direct current to direct current (DC/DC) converter according to various topologies, for example, Buck, Boost, Buck/Boost, Buck+Boost, Flyback, Forward, Cuk and charge pump converters. According to some aspects of the disclosure, a power converter may be a direct current to alternating current converter (DC/AC), e.g. an inverter or a micro-inverter.

According to some aspects, junction box 101 might not include an integrated power converter, with an externally connected device affecting and/or setting an operating point for the substrings SS1-SS3.

Junction box 101 may include a communication device such as a wired communication device, a wireless communication device, and/or an acoustic communication device, etc. The communication device may include a receiver, monitor and/or transmitter. The communication device may communicate using, for example, Power Line Communications (PLC), other methods of wired communication, Wi-Fi™, ZigBee™, Bluetooth™, cellular communications, other method of wireless communication and/or acoustic communication. The communication device may be communicatively coupled to one or more controllers configured to control other components in junction box 101, such as a power converter, safety mechanism and/or sensor(s)/sensor interface(s). The communication device may enable junction box 101 to communicate with other junction boxes having communication devices, and/or additional power devices in the same system or in other systems. Junction box 101 may include one or more safety switches which may be controlled by a controller. The safety switches may be used to disconnect PV generator 100 or sections thereof from other parts of the PV system, and/or to short-circuit one or more of substrings SS1-SS3 to reduce power generated by one or more of substrings SS1-SS3.

Junction box 101 may be mechanically mounted onto PV generator 100. A bypass mechanism may be provided so that one or more of substrings SS1-SS3 may be bypassed under certain conditions. For example, if substring SS1 is shaded and/or underperforming it may be bypassed to avoid affecting an operating point of substrings SS2 and SS3 and potentially lowering output power of substrings SS2 and SS3.

If substring SS1 is shaded and/or underperforming, it may be bypassed to avoid a current being forced through substring SS1 which may result in power loss, overheating and/or damage to substring SS1. The bypass mechanism may include a passive element such as a diode, and/or an active element such as a controlled switch (e.g., MOSFET, IGBT, BJT, and/or relay switch). According to some aspects of the disclosure, the bypass mechanism may be part of a power device configured to convert power harvested from PV generator 100. The bypass mechanism may be housed in junction box 101 which may be mounted onto PV generator 100.

Figure 2A:
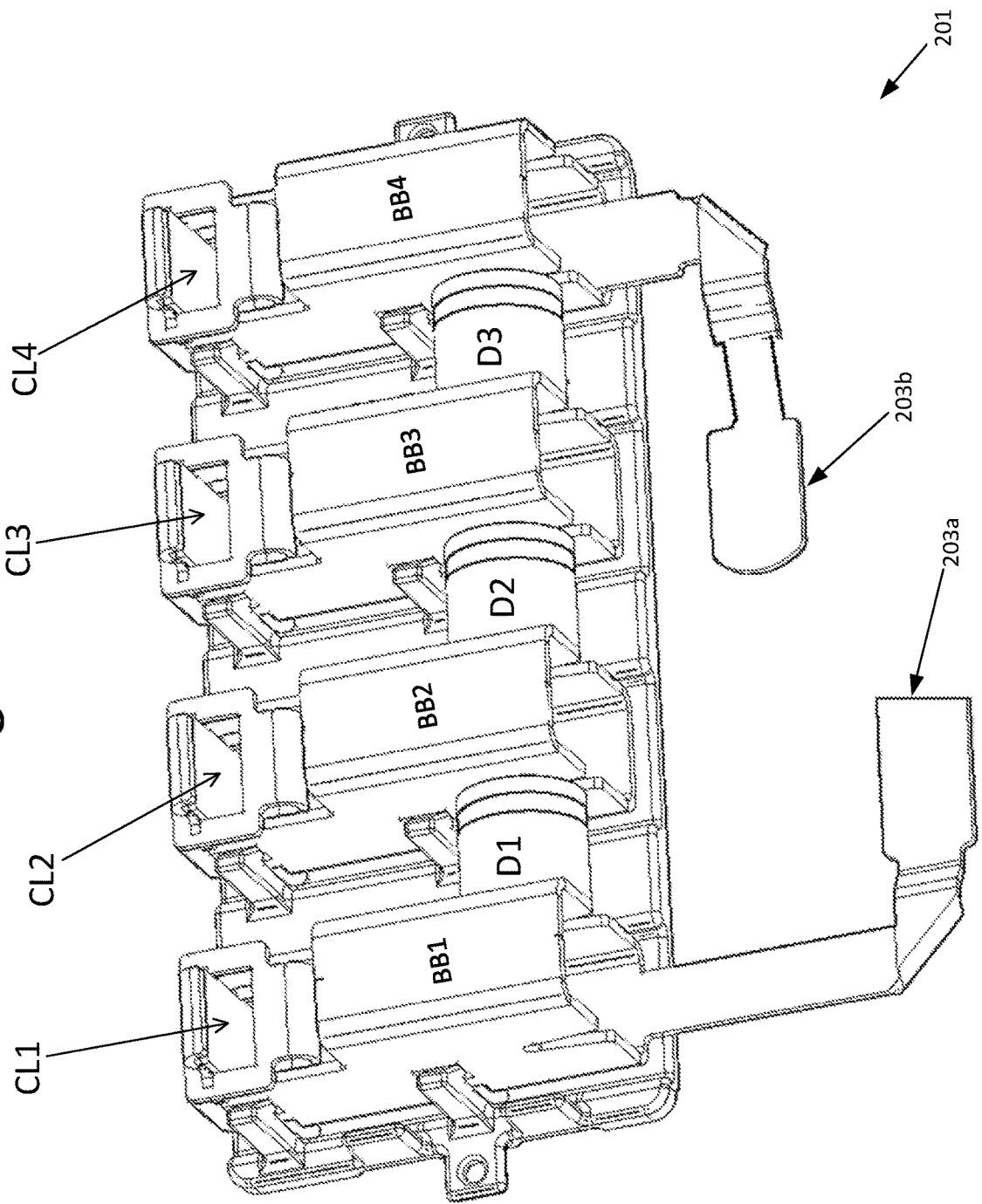
FIG. 2A illustrates a view of part of a PV generator electrical circuit in accordance with one or more illustrative embodiments.

Reference is now made to FIG. 2A, which illustrates a PV panel junction box component 201 according to aspects of illustrative embodiments. Junction box 101 of FIG. 1 may include a junction box component 201, as depicted in FIG. 2A. A PV generator comprising a number of photovoltaic cell substrings or a number of PV cells configured in a string array, may include a number of bypass mechanisms. FIG. 2A illustrates a junction box component 201 including one or more bypass mechanisms such as bypass mechanisms D1, D2, D3 according to an illustrative embodiment. Junction box component 201 may include a first bypass mechanism D1, a second bypass mechanism D2 and a third bypass mechanism D3. In the illustrative embodiment of FIG. 2A, bypass mechanisms D1-D3 are diodes. In alternative embodiments, a controlled switch (e.g., a MOSFET) may be used to reduce bypass losses (i.e., the power lost as a result of activation of a bypass mechanism). Bypass mechanism D1 may bypass a first section, photovoltaic cell or substring of a PV panel which may be electrically coupled to junction box component 201 between a first connector location CL1 and a second connector location CL2. Bypass mechanism D2 may bypass a second section, photovoltaic cell or substring of a PV panel which may be electrically coupled to junction box component 201 between a first connector location CL2 and a second connector location CL3. Bypass mechanism D3 may bypass a third section, photovoltaic cell or substring of a PV panel which may be electrically coupled to junction box component 201 between a first connector location CL3 and a second connector location CL4. Connectors in connector locations CL1-CL4 may be suitable for receiving conductors coupled to photovoltaic substrings. For example, the connectors at connector locations CL1-CL4 may include ribbon wire receptacles.

Junction box component 201 may have a first output conductor 203a and a second output conductor 203b. Output conductors 203a and 203b may transfer power to a power device (e.g., a power converter or a safety device) or to output terminals of a PV generator (e.g., output terminals of a PV panel). Other embodiments may feature a different number of bypass mechanisms corresponding to the number of photovoltaic elements which are designed with a bypass. For example, a PV generator comprising five serially coupled substrings may include five bypass mechanisms. As another example, a single substring of twenty photovoltaic cells may include twenty bypass mechanisms, one for each photovoltaic cell. In a different embodiment there may be twenty photovoltaic cells divided into four groups of five cells and there may be four bypass mechanisms, one for each group.

According to some aspects, when current enters a power generator through an output conductor 203a of junction box component 201, it may first flow through a conducting bus bar BB1. If a PV generator (e.g., substring SS1 of FIG. 1) coupled between connection locations CL1 and CL2 is operating at a capacity which supports the current flowing through output conductor 203a, the entire current may flow through the coupled PV generator to bus bar BB2. Similarly, if a PV generator (e.g. substring SS2 of FIG. 1) coupled between connection locations CL2 and CL3 is operating at a capacity which supports the current flowing through output conductor 203a, the entire current may flow through the coupled PV generator to bus bar BB3. Similarly, if a PV generator (e.g. substring SS3 of FIG. 1) coupled between connection locations CL3 and CL4 is operating at a capacity which supports the current flowing through output conductor 203a, the entire current may flow through the coupled PV generator to bus bar BB4.

If a PV generator coupled between two bus bars is unable to carry the full current, forcing the full current through the PV generator may cause a reverse voltage to develop between two bus bars, which may, in turn, result in the bypass mechanism turning ON. In the illustrative embodiment of FIG. 2A, providing diodes between bus bars may cause automatic bypassing in case of reverse voltage between bus bars. According to some aspects of the disclosure, an active switch may be disposed between bus bars and may be set to the ON position in response to detection of a reverse voltage condition. For example, a voltage sensor may measure a voltage between two bus bars and provide voltage measurements to a controller. Upon detecting a voltage indicative of a reverse voltage condition, the controller may set a switch disposed between the two bus bars to the ON position.

Providing bypass paths may reduce total system power loss and/or prevent damage to equipment, and may also cause a rise in temperature in certain components or at certain locations in junction box component 201. One of the components that may experience a rise in temperature is the bypass mechanism. For example, bypass diodes may generate significant heat when carrying currents typical of PV generators (e.g., 8A, 10A or even more). Depending on the current which may flow through the bypass mechanism and the characteristics of the bypass mechanism, there may be a need to extract heat from one or more bypass mechanisms. Various heat-dissipation methods exist, including leveraging different ways heat may transfer such as conduction, convection and radiation, which may be employed with the configurations discussed herein. In one embodiment, a fan (not shown) may be positioned in junction box 101 (FIG. 1) in order to transfer the heat from the overheated bypass mechanism's which may cause a relatively high convection coefficient compared to the convection coefficient of standing air. In a second embodiment, cooler agents such as water (not shown) may be positioned in a manner avoiding harm to the electrical circuit but still transferring the heat faster than standing air would, such as a phase change cooler. In a third embodiment cryogenic coolers (not shown) may be used to lower specific heat spots. According to some aspects of the disclosure, enhanced cooling may include changing a conductive coefficient associated with elements thermally coupled to components which are to be cooled. A first way to improve the conductive coefficient may include changing a design or shape of various components and their assembly design. A second way to improve a conductive coefficient may include adding heat dissipation mechanisms which may increase the heat-transfer rate. For example, applying thermal grease (not shown) between junction box component and junction box. Thermal pads, thermal putty, thermal paste and/or laminated Kapton® polyimide film may be used instead of or in addition to thermal grease for transferring the heat from one or more bypass mechanisms.

Bus bars BB1-BB4 as illustratively depicted in FIG. 2A show another example for improving a conductive coefficient and transferring heat quickly so that the bypass mechanisms do not overheat. Bus bars BB1-BB4 may be coupled to bypass mechanisms D1-D3, and may be housed in the base of junction box 101 (FIG. 1). When current flows through bypass mechanisms D1-D3, the temperature at bypass mechanisms D1-D3 may rise. Bus bars BB1-BB4, which may be conductive, may draw and evacuate the heat to the base of junction box 101 and through an associated power generator, keeping the temperature under an acceptable threshold. In another embodiment, bus bars BB1-BB4 may transfer heat towards the cover of junction box 101 (FIG. 1), and from the cover to the environment.

When bus bars BB1-BB4 spread heat in more than one direction, for example, a first direction towards the base of junction box 101 and a second direction towards the cover of junction box 101, they may be referred to as multi-directional heat spreaders. In embodiments featuring bus bars BB1-BB4 additionally functioning as heat spreaders, the walls of junction box 101 may function as heat sinks. Bus bars BB1-BB4 may also be designed to spread heat to a third and fourth direction. According to some aspects of the disclosure, bus bars BB1-BB4 may include cooling fins designed in one or more shapes and extending in one or more directions.

Reference is now made to FIG. 2B, which illustrates a PV string section 205 including a string of coupled PV generators 200a-200d according to aspects of one or more illustrative embodiments. PV string section 205 may include a plurality of PV generators, e.g., four PV generators 200a-200d as depicted in FIG. 2B. PV generators 200a-200d may each include one of junction boxes 202a-202d, respectively, and junction boxes 202a-202d may each include junction box components 201a-d, respectively. Junction box components 201a-d may be designed and have the same components as junction box component 201 of FIG. 2A, such as: connection locations CL1-CL4, bypass mechanisms D1-D3, bus bars BB1-BB4 and output conductors 203a and 203b. For example, junction box component 201b may be coupled to junction box component 201a of junction box 202a and PV generator 200a via conductor 210a and may be coupled to junction box component 201c of junction box 202c and PV generator 200c via conductor 210b. Conductor 210a may be coupled between a first output conductor 203a of junction box component 201b and a second output conductor 203b of junction box component 201a.

Reference is now made to FIGS. 2C-2F which illustrate part of a PV generator junction box according to aspects of illustrative embodiments. Bus bars BB1-BB4 and bypass mechanisms D1-D3 may be the same as bus bars BB1-BB4 and bypass mechanisms D1-D3 of FIG. 2A. According to some aspects of the disclosure bus bars BB1-BB4 may all or partially include additional heat spreaders which may cover partially or fully one or more of the bypass mechanisms D1-D3. The additional heat spreaders may be flat or may include fins, such as straight or pin shaped fins. The additional heat spreaders may be made of effective heat-spreading materials, such as metal, or a material having heat-spreading capabilities.

FIG. 2C illustrates illustrative embodiments where bus bars BB1-BB4 may be multi-directional heat spreaders, spreading heat towards a base 206c of a PV power generator junction box and a cover 207c of the PV power generator junction box. In addition, providing multi-directional heat spreading, bus bars BB1-BB4 may include one or more additional heat spreaders R1a-R4a which may have a larger surface area than bus bars BB1-BB4. According to some aspects of the disclosure. Heat spreaders R1a and R2a may partially or fully cover bypass mechanism D1 and heat spreaders R3a and R4a may partially or fully cover bypass mechanism D3. Heat spreaders R1a-R4a may be flat or may have fins, such as straight or pin shaped fins. Including heat spreaders R1a-R4a may spread heat at a more effective rate.

With reference to FIG. 2D, heat spreaders R2b and R3b may extend to cover part or all of bypass mechanism D2. If heat spreaders R2b and R3b are made of electrically conductive material, a gap may be maintained between heat spreaders R2b and R3b to avoid short-circuiting bypass mechanism D2.

Figure 2E:
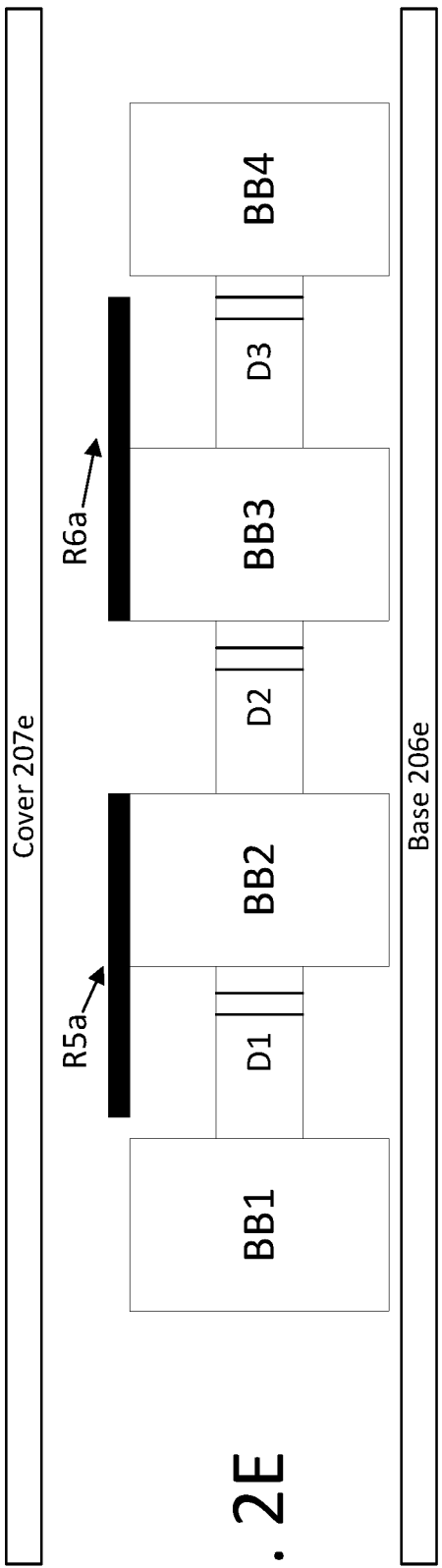

FIG. 2E illustrates some embodiments where BB1-BB4 may be multi-directional heat spreaders, spreading heat in the direction of a base 206e of a PV power generator junction box and a cover 207e of the PV power generator junction box. Bus bars BB2-BB3 may include additional heat spreaders on one end R5a and R6a which may have larger surface areas than bus bars BB2 and BB3 and therefor may increase the rate of the heat dissipation. Heat spreaders R5a and R6a may be attached to the tops of bus bars BB2 and BB3, respectively, and may extend horizontally to partially or fully cover bypass mechanisms D1 and D3, which may provide enhanced vertical heat spreading. According to some aspects of the disclosure, heat spreaders R5a and R6a may be flat portions of heat-conducting material, and according to some aspects, heat spreaders may be shaped for enhanced heat spreading (e.g. using slats and/or other heat-sink design patterns). According to some aspects of the disclosure, central bus bars BB2 and BB3 may rise to a higher temperature than peripheral bus bars BB1 and BB4 which are closer to the exterior of the junction box. Adding more material to bus bars BB2 and BB3 in order to spread heat may improve the conductive coefficient and keep the temperature under a certain threshold. According to some aspects of the disclosure it may be more efficient to add more surface area and material to bus bars BB2-BB3 rather than adding less material and surface area to bus bars BB1-BB4. Heat spreaders R5a and R6a may partially or fully cover bypass mechanism D1 and D3 respectively. If heat spreader R5a is made of electrically conductive material, a gap may be maintained between heat spreader R5a and bus bar BB1 to avoid short-circuiting bypass mechanism D1. If heat spreader R6a is made of electrically conductive material, a gap may be maintained between heat spreader R6a and bus bar BB4 to avoid short-circuiting bypass mechanism D3.

Figure 2F:
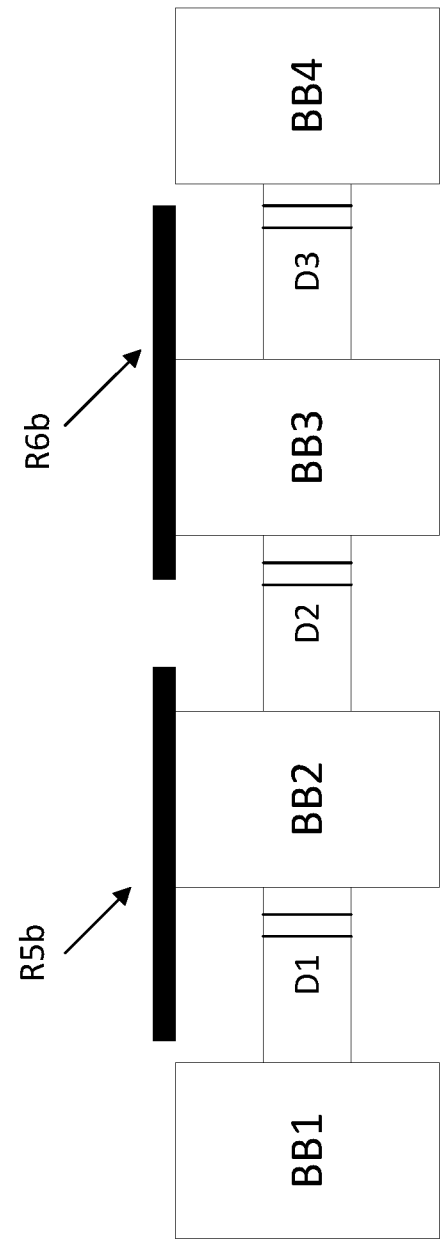

With reference to FIG. 2F, heat spreaders R5b and R6b may extend to cover part or all of bypass mechanism D2. If heat spreaders R5b and R6b are made of electrically conductive material, a gap may be maintained between heat spreaders R6b and R6b to avoid short-circuiting bypass mechanism D2.

Figure 3A:
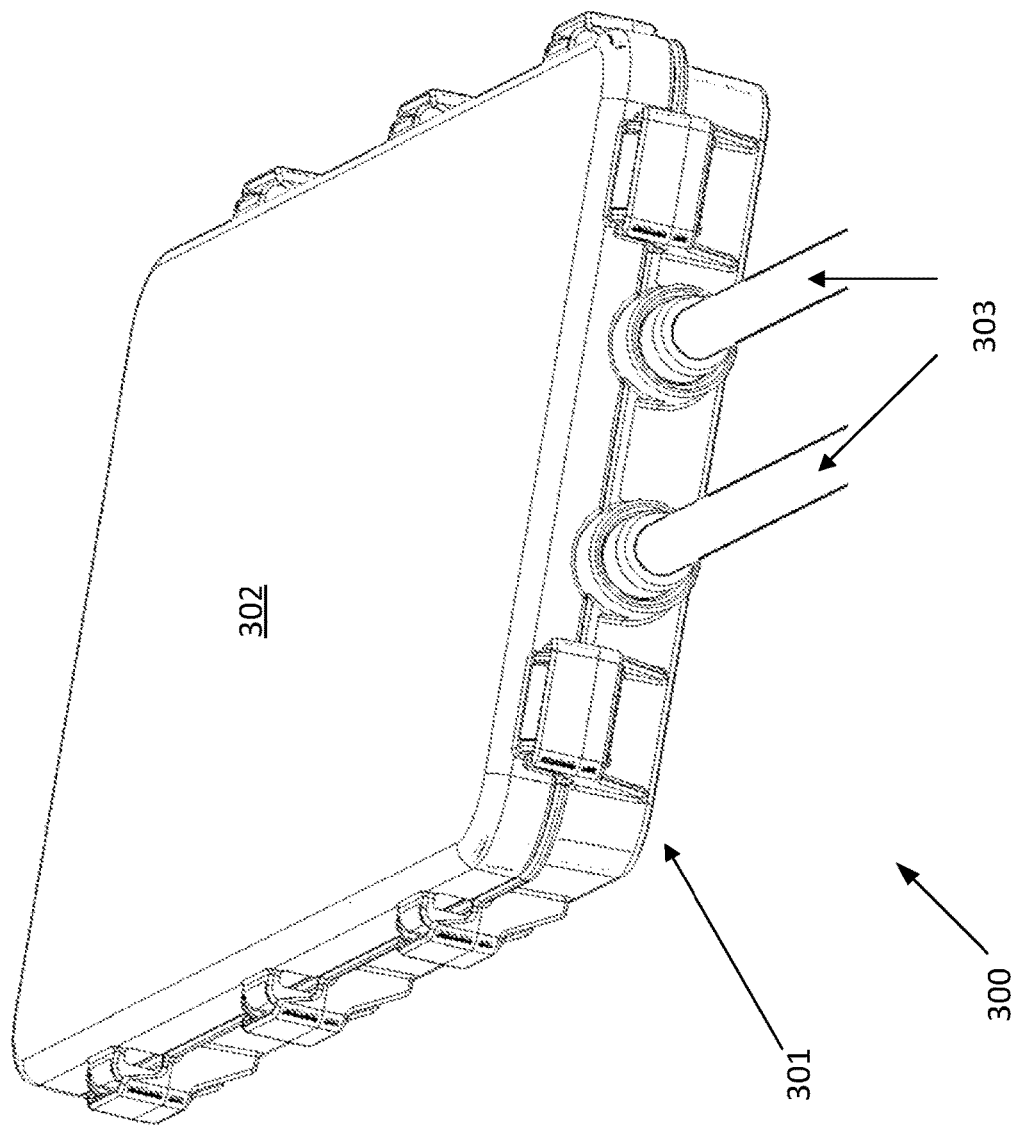
FIG. 3A illustrates a view of a PV generator junction box in accordance with one or more illustrative embodiments.
Figure 3C:
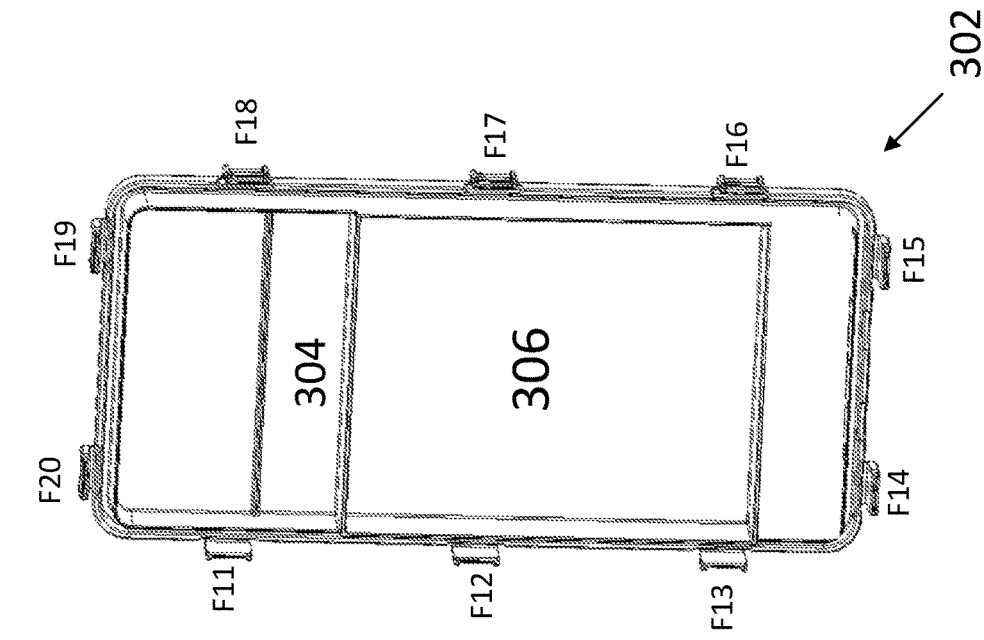
FIG. 3C illustrates an embodiment of a junction box cover in accordance with one or more illustrative embodiments.
Figure 3B:
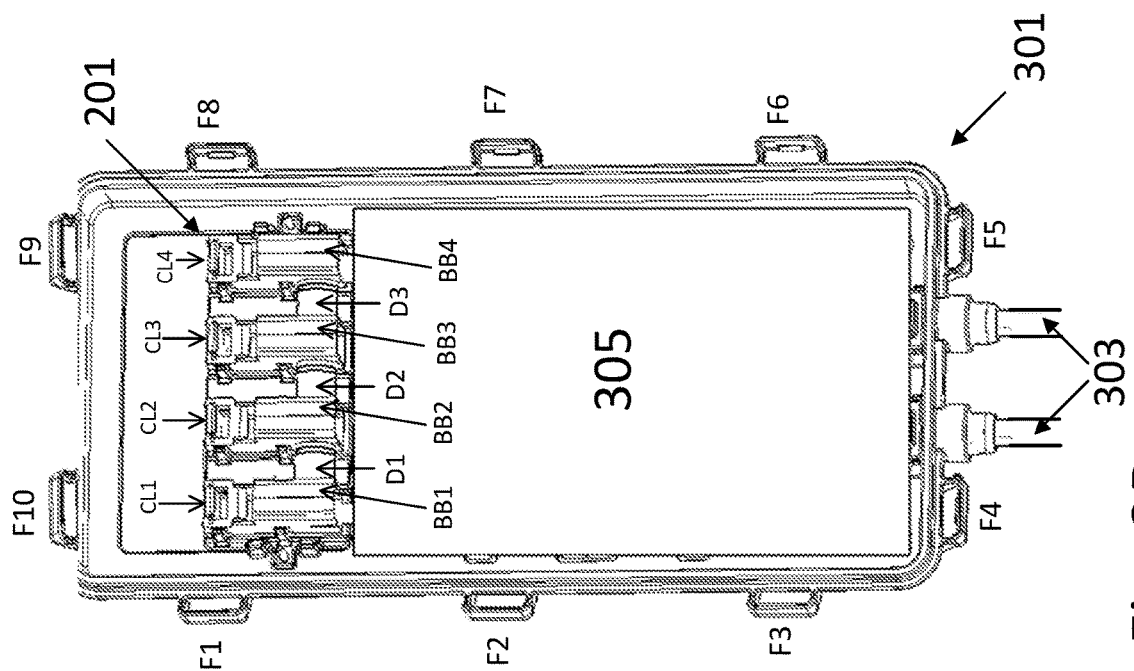
FIG. 3B illustrates an embodiment of a junction box base, in accordance with one or more illustrative embodiments.

Reference is now made to FIG. 3A-3C which illustrate parts of a PV generator junction box according to aspects of illustrative embodiments. A junction box 300 may be the same as or similar to junction box 101 of FIG. 1. Junction box 300 may include a base 301 and a cover 302. Base 301 may include a bottom designed to be attached to a non-photovoltaic part of a photovoltaic generator (e.g. a back side, or a side bar) and an opening designed to be covered. Junction box 300 may also include output conductors 303. In some photovoltaic strings, conductors 303 may be coupled to junction boxes providing power collected from other photovoltaic generators. According to some aspects, conductors 303 may be coupled to a power device (e.g., a DC/DC converter, a DC/AC inverter, a safety device and/or a monitoring device) and may be coupled to a PV power system device. Conductors 303 may be the same or similar to output conductors 103a and 103b of FIG. 1.

Reference is now made to FIG. 3B, which illustrates a junction box base 301 of junction box 300 of FIG. 3A, according to illustrative embodiments. Junction box component 201 may be housed in the inner side of base 301. Conductors 303 may be coupled to junction box component 201 and may extract output current or power from junction box component 201. Junction box base 301 may include one or more locks which may be have corresponding locks and/or receptacles on junction box cover 302 (of FIG. 3C) designed to lock junction box base 301 to junction box cover 302. For example, junction box base 301 may have click-on locks F1-F10 which may be coupled to corresponding receptacles on a top to the junction box. According to some aspects of the disclosure, junction box base 301 may include area 305 for housing additional circuitry (e.g., power devices, as explained above) coupled between output conductors 303 and junction box component 201.

Reference is now made to FIG. 3C, which illustrates a junction box cover 302 of junction box 300 of FIG. 3A, according to illustrative embodiments. Junction box cover 302 may include receptacles F11-F20 which are configured to click onto click-on locks (for example, click-on locks F1-F10 of FIG. 3B). Area 304 in cover 302 may include a heat dissipation mechanism, for example, thermal grease, thermal pads, thermal putty, thermal paste, or a phase changer. The heat dissipation mechanism at area 304 may be thermally coupled to junction box component 201 when base 301 is covered by cover 302, which may help bus bars BB1-BB4 of junction box component 201 spread heat across cover 302 and prevent the heat from concentrating in specific hot spots. According to some aspects of the disclosure, junction box cover 302, at or under area 304, may include a section made of a material (e.g., polyphenylene sulfide, polyetherimide, polyethersulfone) with certain characteristics which may withstand heat dissipated from the bypass mechanisms in junction box component 201. Junction box cover 302 may be mostly made of a first material selected to withstand a first temperature, and a section (e.g., at area 304) of junction box cover 302 may be made of a second material selected to withstand a second temperature which may be higher than the first temperature. In other embodiments (not shown), junction box component 201 may be mounted onto cover 302. According to some aspects of the disclosure, cover 302 may include area 306 for housing additional circuitry (e.g., power devices, as explained above) to be coupled between output conductors 303 and junction box component 201 when junction box base 301 is attached to junction box cover 302.

According to some aspects in which junction box 300 includes a power device, the power device, like junction box component 201, may be mounted on base 301 or may be mounted on cover 302. The power device may include a DC/DC converter, a power point tracker (PPT), an external bypass system, a DC/AC converter, a control system, a signaling mechanism, signal receiver or monitor and/or one or more sensors/sensor interfaces such as temperature, voltage or current sensors.

Reference is now made to FIG. 4 which illustrates a PV power generator and parts of a PV power generator junction box according to aspects of illustrative embodiments. According to some aspects of the disclosure, a PV generator 400 may be a photovoltaic panel and may have one or more substrings (e.g. substrings similar to substrings SS1-SS3 of FIG. 1). Junction box base 401 may be mounted on a side of PV generator 400. PV power generator 400 may include a number of substrings (similar to as shown in FIG. 1). According to some aspects of the disclosure, junction box base 401 may include additional circuitry, such as a control unit, a power converter, a communication device, a power device, a safety device, a sensor interface, a signaling mechanism, a switch or a system device. Junction box cover 402 may be designed to connect to and cover junction box base 401. According to some aspects, instead of or in addition to installing, integrating or mounting circuitry on junction box base 401, additional circuitry may be mounted on, installed in or integrated in junction box cover 402, with the circuitry and junction box components designed to electrically connect the circuitry to corresponding circuitry on the junction box base side. Mounting circuitry on junction box cover 402 may increase ease of repairing and replacing. For example, if circuitry mounted on junction box cover 402 malfunctions, a replacement may be quick and easy: the junction box cover 402 may be removed and replaced with a different junction box cover 402 comprising new circuitry.

Power generated by PV generator 400 may be output via conductors 403a and 403b. According to some aspects of the disclosure, conductors 403a and 403b may be coupled to junction box base 401 (not shown). In the illustrative embodiment shown in FIG. 4, conductors 403a and 403b may be coupled to junction box cover 402, and when cover 402 is placed on junction box base 401 conductors 403a and 403b may receive power delivered through junction box base 401. Conductors 403a and 403b may be pre-coupled (e.g. during manufacturing) to junction box cover 402. Pre-coupling conductors 403a and 403b to junction box cover 402 may increase ease and/or speed of installation. For example, if conductors 403a-b connect to junction box base 401, at installation, junction box cover 402 would be connected to junction box base 401, and conductors 403a and 403b would need to be coupled to junction box base 401. By pre-coupling conductors 403a and 403b to junction box cover 402 (e.g., during manufacturing), at installation of junction box cover 402, junction box cover 402 may be mounted onto junction box base 401 and fewer steps may be required. In PV systems including a large number of junction box installations, reducing a need to couple conductors to their respective junction boxes may save a lot of time and make installation easier for the installer.

According to some aspects, a plurality of junction box covers 402s may be coupled using conductors (e.g. 403a, 403b) prior to deploying in a PV system. For example, a plurality of junction box covers 402 may be pre-coupled during manufacturing, each pair of junction box covers coupled by a conductor having a length corresponding to a length or width of a PV generator 400. Pre-coupling junction box covers 402 may further decrease installation time, and may provide substantial costs savings (e.g., by saving the cost of connectors such as MC4 connectors for connecting separate junction box covers 402).

Figure 5A:
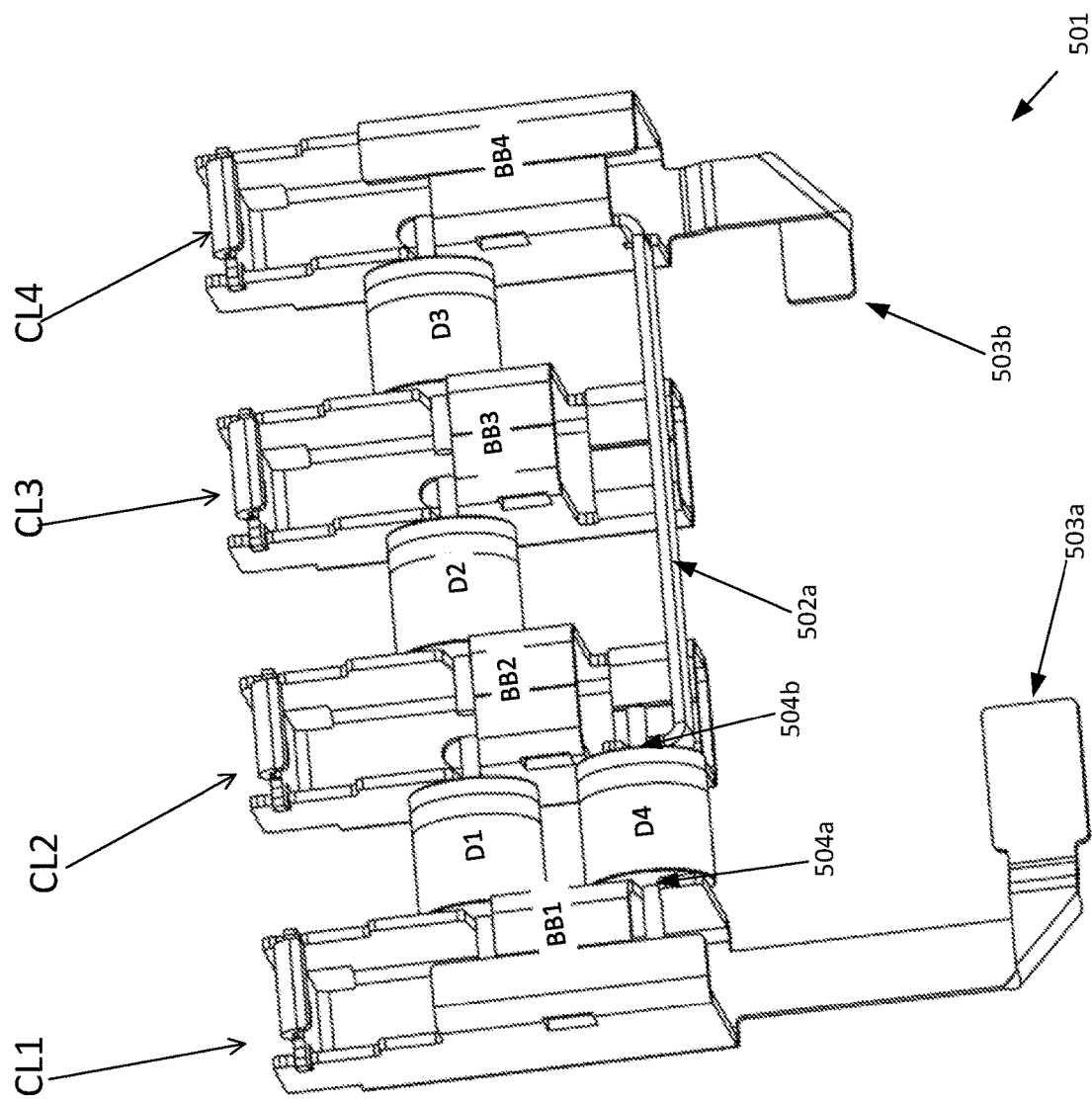
FIG. 5A-5B illustrate two different configurations of a PV generator electrical circuit in accordance with one or more illustrative embodiments.
Figure 5B:
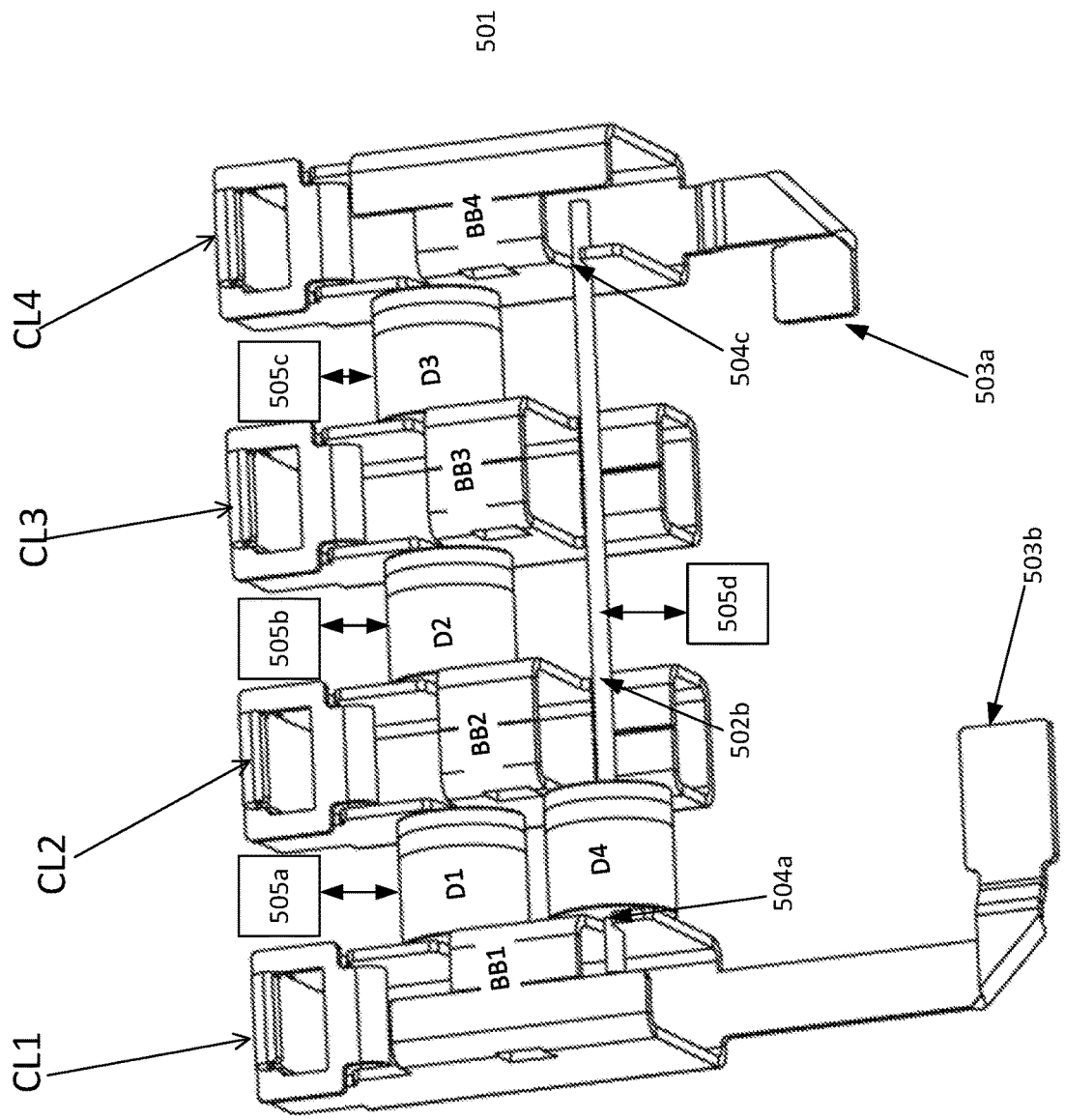

Reference is now made to FIGS. 5A and 5B which illustrate a PV generator junction box component 501 according to aspects of illustrative embodiments. Junction box component 501 may include output conductors 503a and 503b, bus bars BB1-BB4, conductor connectors CL1-CL4 and bypass mechanisms D1-D3 which may be the same or similar to bus bars BB1-BB4 and bypass mechanisms D1-D3 of FIG. 2A. In addition to bypass mechanisms D1-D3, junction box component 501 may have a bypass mechanism D4 configured in a parallel configuration to bypass mechanisms D1-D3. According to some aspects of the disclosure herein, bypass mechanism D4 may be electrically coupled on a first side to bus bar BB1 and may be electrically coupled on a second side to bus bar BB2. According to some aspects, bypass mechanism D4 may be electrically coupled on a first side to output conductor 503a, and on a second side to output conductor 503b. The electrical coupling between bypass mechanism D4 and bus bars BB1 and BB4 may be with a conductor. For example, the conductor may include an additional bus bar 502a or conductive rod 502b.

FIG. 5A shows an illustrative embodiment with bypass mechanism D4 electrically coupled between bus bars BB1 and BB4 using bus bar 502a. Bus bar 502a may be manufactured as part of junction box component 501. Bypass mechanism D4 may have an input conductor and an output conductor which may connect to bus bars BB1 and 502a at points 504a-b using, for example, a clicking mechanism. The clicking mechanism may include points 504a-b which may be sockets in bus bars BB1 and 502a respectively, which input and output conductors of bypass mechanism D4 may click into. As another example, bypass mechanism D4 may be soldered in place between points 504a and 504b.

FIG. 5B shows an illustrative embodiment with bypass mechanism D4 electrically coupled between bus bars BB1 and BB4 using conductive rod 502b. Conductive rod 502b may be manufactured together with bypass mechanism D4 as an output conductor, or may be electrically coupled to an output conductor of bypass mechanism D4 (not explicitly shown). Bypass mechanism D4 may have an input conductor and an output conductor. The input and output conductors of bypass mechanism D4 may connect to bus bars BB1 and BB4 at points 504a and 504c using a clicking mechanism. The clicking mechanism may include points 504a and 504c may be sockets in bus bars BB1 and BB4 respectively, which input and output conductors of bypass mechanism D4 may click into.

According to some aspects and as shown in FIG. 5B, junction box component 501 may include current sensors 505a-d. Current sensors 505a-d may output the size of current to a communication device which may send the different measurements to a monitoring system. Measuring the current flowing through bypass mechanisms D1-D4 may enable or enhance detection of failures in a PV generator or junction box component 501. For example, melting of components in a junction box component 501 may cause short-circuit or open-circuit conditions which may affect current measurements.

In a PV system there may be mismatches between the current flowing through certain parts of the system and the maximum current supported by other parts of the system such as substrings or single photovoltaic cells. Depending on the nature of the mismatch, it may be desirable to bypass certain parts of the PV system, and in some situations it may be desirable to bypass a plurality of coupled substrings or even an entire PV panel. Each bypass mechanism of FIG. 2A (i.e., D1, D2 and D3) may be designed to bypass a respective photovoltaic generator (e.g., a PV substring). In an event that all three of the bypass mechanisms of FIG. 2A are activated, significant electrical losses and heat generation may result. As a numerical example, bypass mechanisms D1-D3 may be diodes having a forward voltage of 0.3V. When all three bypass mechanisms are activated to carry a bypass current of, for example, 10A, total electrical losses may equal $3 \cdot 0.3 \cdot 10 = 9$ W, which may be converted into heat, resulting in a rise in the temperature of the bypass mechanisms and/or nearby electrical components. Over time, the rising temperature may cause component failure.

Providing additional bypass mechanisms in parallel to bypass mechanisms D1-D3 may reduce the number of bypass mechanisms activated at any single time and reduce losses and heat caused by bypass mechanism activation. For example, FIG. 5A illustrates a junction box component 501 of a PV panel having three substrings. If all three substrings are mismatched or underperforming with regard to other PV generators, bypass mechanism D4 may be activated instead of three bypass mechanisms D1-D3. As a numerical example, if bypass mechanism D4 is similar to bypass mechanisms D1-D3 and is activated to carry a bypass current of 10 A, when bypass mechanism D4 is activated instead of bypass mechanisms D1-D3, total electrical losses may equal $1 \cdot 0.3 \cdot 10 = 3$ W, or one-third of the losses which would be caused by activating bypass mechanisms D1-D3. Other multiple bypasses are possible (not shown) such as a bypass mechanism between bus bar BB2 and bus bar BB4. A multiple bypass such as this one may take the output from the first substring and bypass the second and the third substrings. Another possible multiple bypass arrangement may include coupling a bypass mechanism between bus bar BB1 and bus bar BB3. A bypass mechanism coupled between BB1 and BB3 may bypass the first and second substring, still allowing the power of the third substring may be harvested. A PV power generator may have more than 3 substrings and the number of possible bypass arrangements may increase.

Reference is now made to FIG. 6A which is part sketch, part block diagram of a PV generator junction box component 603 mounted in a PV power generator junction box 600 according to aspects of illustrative embodiments. Junction box component 603 may be mounted on a junction box base 601 and may have a first bypass mechanism D1, a second bypass mechanism D2 and a third bypass mechanism D3. Bypass mechanisms D1-D3 may be linked by bus bars BB1-BB4. A fourth bypass mechanism D4 may be coupled to junction box component 603 between bus bars BB1 and BB4, providing a bypass route between bus bars BB1 and BB4 in parallel to bypass mechanisms D1-D3. Junction box cover 602 may house a heat spreader and/or other circuitry such as a power converter, communication device and/or sensors/sensor interfaces, which may be electrically coupled to junction box component 603 when junction box 600 is closed and junction box cover 602 is mounted onto junction box base 601.

Reference is now made to FIG. 6B which is part sketch, part block diagram of a PV generator junction box component 603 mounted in a PV power generator junction box 600 according to aspects of illustrative embodiments. According to some aspects of the disclosure, as shown in FIG. 6B, junction box component 603 and bus bars BB1-BB4 may be mounted on a junction box cover 602. Junction box base 601 may house conductors which may link substrings 604 of a PV generator to junction box component 603 when junction box base 601 is mounted on a PV panel and junction box cover is mounted onto junction box base 601.

Reference is now made to FIG. 6C which is part sketch, part block diagram of a PV generator junction box component 603 mounted in a PV power generator junction box 600 according to aspects of illustrative embodiments. According to some aspects of the disclosure, as shown in FIG. 6C, junction box component 603 may be mounted onto junction box base 601. Bypass mechanism D4 may be mounted onto junction box cover 602 and positioned so that when junction box cover 602 is aligned with junction box base 601 and the junction box is closed (i.e. by fastening junction box cover 602 to junction box base 601), bypass mechanism D4 is coupled to junction box component 603. When junction box cover 602 is aligned with junction box base 601 and the junction box is closed bypass mechanism may be coupled to junction box component 603 and may be linked between bus bars BB1 and BB4.

According to some embodiments, disposing bypass mechanisms D1-D4 on junction box base 601 (e.g. as in FIG. 6A) may provide certain safety advantages. For example, bypass mechanisms D1-D4 may be fixed in place (e.g., by soldering or mechanical connection) during manufacturing, to ensure provision of a bypass path in case of a mismatch or underperforming PV generator or string, without risk of an improper manual mechanical connection of the bypass mechanisms.

According to some embodiments, disposing bypass mechanisms D1-D4 on junction box cover 602 (e.g. as in FIG. 6B) may provide certain thermal advantages. For example, dissipation of heat from bypass mechanisms mounted on junction box cover 602 to the environment may be faster and more effective than dissipation of heat from bypass mechanisms mounted on junction box base 601 to a PV generator and then from the PV generator to the environment.

According to some embodiments, disposing a first group of bypass mechanisms (e.g. D1-D3) on junction box base 601 and a second group of bypass mechanisms (e.g. D4) on junction box cover 602 (e.g. as in FIG. 6C) may both safety and thermal advantages. The first group of bypass mechanisms may ensure provision of a bypass path in case of a mismatch or underperforming PV generator or string, without risk of an improper manual mechanical connection of the bypass mechanisms. The second group of bypass mechanisms may reduce electrical loss and heat generation, and may be disposed on junction box cover 602 to dissipate heat in a manner which may be faster and more effective than dissipation of heat from bypass mechanisms mounted on junction box base 601.

According to some aspects, depending on the number of bypass mechanisms in junction box component 603, there may be one or more bypass mechanisms mounted on junction box base 601 and there may be one or more bypass mechanisms mounted on junction box cover 602. For example, two bypass mechanisms may be mounted on junction box base 601, and two bypass mechanisms may be mounted on junction box cover 602, while the bypass mechanisms are placed and configured to be coupled to their respected bus bars when junction box base 601 and junction box cover 602 are aligned and junction box 600 is closed.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another. For example, cover 402 of FIG. 4 may include heat dissipation mechanisms such as heat dissipation mechanisms included in area 304 of FIG. 3C. As another example, junction box component 501 of FIG. 5A may include heat spreaders R5$b$ as shown in FIG. 2E.

The invention claimed is:

1. A junction box comprising:
a base;
a cover configured to be mounted over the base;
two bus bars disposed within the junction box, and at least one bypass mechanism coupled between the two bus bars;
a power device disposed within the junction box;
a heat dissipation mechanism mounted on the cover or on the base, and
wherein the heat dissipation mechanism is in thermal contact with the power device when the cover is mounted over the base, and
wherein at least one of the bus bars includes a first heat spreading part designed to conduct heat in a first direction and a second heat spreading part designed to conduct heat in a second direction.

2. The junction box of claim 1, wherein at least one of the bus bars is a multi-directional heat spreader.

3. The junction box of claim 1, wherein at least one of the bus bars is designed to conduct heat in a direction of the base and in a direction of the cover.

4. The junction box of claim 1, further comprising a plurality of connectors, each connector designed to be connected to a conductor carrying current from a photovoltaic generator, and each connector electrically coupled to at least one of the bus bars.

5. The junction box of claim 1, wherein the at least one bypass mechanism includes at least one diode.

6. The junction box of claim 1, further comprising a plurality of bus bars, wherein the at least one bypass mechanism comprises a plurality of bypass mechanisms, wherein the plurality of bypass mechanisms are serially coupled.

7. The junction box of claim 6, further comprising an additional bypass mechanism disposed in parallel to two or more bypass mechanisms of the plurality of bypass mechanisms.

8. The junction box of claim 7, wherein the additional bypass mechanism is electrically coupled between a first bus bar of the plurality of bus bars and a last bus bar of the plurality of bus bars.

9. The junction box of claim 7, wherein the additional bypass mechanism includes a diode.

10. The junction box of claim 7, wherein the additional bypass mechanism is a controlled switch.

11. The junction box of claim 7, further comprising an additional bus bar, wherein the additional bypass mechanism is coupled between a bus bar of the plurality of bus bars and the additional bus bar.

12. The junction box of claim 7, wherein the additional bypass mechanism is coupled between two bus bars of the plurality of bus bars via a conductive rod extending from the additional bypass mechanism to at least one of two bus bars of the plurality of bus bars.

13. The junction box of claim 1, wherein the at least one bypass mechanism comprises a plurality of bypass mechanisms, the junction box further comprising an additional bypass mechanism mounted on the cover, wherein, when the cover is mounted over the base, the additional bypass mechanism is disposed in parallel to two or more bypass mechanisms of the plurality of bypass mechanisms.

14. The junction box of claim 1, wherein the power device is configured to convert DC power having a first voltage generated by a power generator to AC power or DC power having a second voltage.

15. The junction box of claim 1, wherein the cover comprises a communication device communicatively coupled to one or more controllers configured to control at least one component in the junction box.

16. The cover of claim 1 further comprising a section comprising a material which withstands heat dissipated from the at least one bypass mechanism.

17. A method comprising:
  coupling a bypass mechanism between two bus bars, the two bus bars and the bypass mechanism being comprised in a base of a junction box, the junction box further comprising walls which function as heat sinks; and
  coupling a cover and a base, wherein at least one of the cover and the base comprises a heat dissipation mechanism;
  wherein the heat dissipation mechanism is in contact with a power device when the cover is mounted over the base, and
  wherein at least one of the two bus bars includes a first heat spreading part designed to conduct heat in a first direction and a second heat spreading part designed to conduct heat in a second direction.

18. The method of claim 17, wherein at least one of the bus bars is designed to conduct heat in a direction of the base and in a direction of the cover.

19. The method of claim 17, further comprising converting, using the power device, DC power having a first voltage generated by a power generator to AC power or DC power having a second voltage.

* * * * *